United States Patent
Wang et al.

(10) Patent No.: US 11,740,303 B2
(45) Date of Patent: Aug. 29, 2023

(54) METHOD OF DESIGNING A HIGH SHIELDING GRADIENT COIL FOR A PLANAR SUPERCONDUCTING MAGNETIC RESONANCE IMAGING SYSTEM AND GRADIENT COIL THEREOF

(71) Applicant: INSTITUTE OF ELECTRICAL ENGINEERING, CHINESE ACADEMY OF SCIENCES, Beijing (CN)

(72) Inventors: Yaohui Wang, Beijing (CN); Qiuliang Wang, Beijing (CN)

( * ) Notice: Subject to any disclaimer, the term of this patent is extended or adjusted under 35 U.S.C. 154(b) by 0 days.

(21) Appl. No.: 17/628,555

(22) PCT Filed: Nov. 26, 2020

(86) PCT No.: PCT/CN2020/131610
§ 371 (c)(1),
(2) Date: Jan. 19, 2022

(87) PCT Pub. No.: WO2021/104337
PCT Pub. Date: Jun. 3, 2021

(65) Prior Publication Data
US 2022/0365154 A1 Nov. 17, 2022

(30) Foreign Application Priority Data
Nov. 29, 2019 (CN) .......................... 201911199616.5

(51) Int. Cl.
*G01R 33/421* (2006.01)
*G01R 33/3815* (2006.01)
*G01R 33/385* (2006.01)

(52) U.S. Cl.
CPC ....... *G01R 33/4215* (2013.01); *G01R 33/385* (2013.01); *G01R 33/3815* (2013.01)

(58) Field of Classification Search
CPC ............ G01R 33/4215; G01R 33/3815; G01R 33/385; G01R 33/3806
See application file for complete search history.

(56) References Cited

U.S. PATENT DOCUMENTS 9,864,022 B2 1/2018 Watanabe et al.
10,634,745 B2 4/2020 Overweg
(Continued)

FOREIGN PATENT DOCUMENTS

CN 101266289 A 9/2008
CN 101268529 A 9/2008
(Continued)

OTHER PUBLICATIONS

Machine translation of JP-2010284184-A (Year: 2010).*
(Continued)

*Primary Examiner* — G. M. A Hyder
(74) *Attorney, Agent, or Firm* — Verrill Dana, LLP; Robert L. Hover

(57) ABSTRACT

The present application provides a method of designing a high shielding gradient coil for a planar superconducting magnetic resonance imaging (MRI) system and a gradient coil thereof, the method determines a shielding area according to an outer profile of a metal conductor around the position of the gradient coil in the planar superconducting MRI system, and performs partitioned shielding of a stray field. The constraint values of stray fields at different partitioned zones of the shielding area are adjusted according to the shielding requirements. The primary coils of both the transverse gradient coil and the longitudinal gradient coil optimized by the design method of the high shielding gradient coil contain a reverse coil, which generates a (Continued)

magnetic field that offsets leakage magnetic field of other coils, thus achieving the purpose of reducing the stray field of the gradient coil.

4 Claims, 7 Drawing Sheets

(56) References Cited

U.S. PATENT DOCUMENTS

| | | | |
|---|---|---|---|
| 10,656,223 B2 | 5/2020 | Hamada et al. | |
| 2009/0261246 A1 | 10/2009 | Neuberth et al. | |
| 2010/0295640 A1 | 11/2010 | Tamura | |

FOREIGN PATENT DOCUMENTS

| | | | | | |
|---|---|---|---|---|---|
| CN | 101533077 | A | | 9/2009 | |
| CN | 101728050 | A | | 6/2010 | |
| CN | 101996273 | A | * | 3/2011 | |
| CN | 102176368 | A | | 9/2011 | |
| CN | 102376410 | A | | 3/2012 | |
| CN | 101996273 | B | | 7/2012 | |
| CN | 103077798 | A | | 5/2013 | |
| CN | 105097180 | A | | 11/2015 | |
| CN | 105718677 | A | * | 6/2016 | G06F 30/367 |
| CN | 105718677 | A | | 6/2016 | |
| CN | 106128689 | A | | 11/2016 | |
| CN | 104685584 | B | | 7/2017 | |
| CN | 107064842 | A | | 8/2017 | |
| CN | 108802645 | A | | 11/2018 | |
| CN | 109642932 | A | | 4/2019 | |
| CN | 109696645 | A | | 4/2019 | |
| CN | 110780245 | A | | 2/2020 | |
| DE | 102008020107 | B4 | | 8/2011 | |
| EP | 3561534 | A1 | | 10/2019 | |
| JP | 2010272663 | A | | 12/2010 | |
| JP | 2010284184 | A | * | 12/2010 | G06F 30/367 |
| JP | 6138600 | B2 | | 5/2017 | |
| JP | 2019531112 | A | | 10/2019 | |
| WO | 2014050621 | A1 | | 4/2013 | |

OTHER PUBLICATIONS

Machine translation of CN-10996273-A (Year: 2011).*
Machine translation of CN-105718677-A (Year: 2016).*
International Search Report and Written Opinion issued in corresponding International Application No. PCT/CN2020/131610, dated Mar. 3, 2021, with English translations, 22 pages.
First Office Action issued in corresponding CN App. No. 201911199616, dated Jan. 28, 2021.
Optimal design of open self-shielded high-field superconducting MRI magnet for whole-body imaging, Feng Zhongkui, Hu Geli, Xu Ying, Zhu Guang, Zhou Feng, Dai Yinming, Wang Qiuliang, 2013, 62 (23): 230701. doi: 10.7498/aps.62.230701.
Yarkoni, T., Poldrack, R., Nichols, T. et al. Large-scale automated synthesis of human functional neuroimaging data. Nat Methods 8, 665-670 (2011). https://doi.org/10.1038/nmeth.1635. Abstract.
Z. Ni, Q. Wang and C. Wang, "Design of Axial Shim Coils for Magnetic Resonance Imaging," in IEEE Transactions on Applied Superconductivity, vol. 21, No. 3, pp. 2084-2087, Jun. 2011, doi: 10.1109/TASC.210.2098013.
Zhang P, Shi Y, Wang W, Wang Y. A spiral, bi-planar gradient coil design for open magnetic resonance imaging. Technol Health Care. 2018;26(1):119-132. doi: 10.3233/THC-171081. PMID: 29254119.

* cited by examiner

US 11,740,303 B2

METHOD OF DESIGNING A HIGH SHIELDING GRADIENT COIL FOR A PLANAR SUPERCONDUCTING MAGNETIC RESONANCE IMAGING SYSTEM AND GRADIENT COIL THEREOF

TECHNICAL FIELD

The present application relates to a method of configuring a high shielding gradient coil for a planar superconducting magnetic resonance imaging (MRI) system and a gradient coil thereof.

BACKGROUND

A planar magnetic resonance imaging (MRI) system has an open structure, which can reduce the claustrophobia of patients and make it easier for medical staff to approach patients for interventional therapy. Permanent-magnet MRI systems are commonly-used planar MRI systems, that is, the magnet part thereof is composed of permanent magnets. Such a MRI system generally has a low field strength, and the stability of the magnetic field is easily affected by the ambient temperature. In contrast, the magnet part of a planar superconducting MRI system is made of superconducting material, which can generate a magnetic field with high strength and good stability. However, there are many metal structures in the magnet part of a superconducting MRI system, and the gradient coils are close to the surrounding metal structures. When the gradient magnetic field is switching, eddy currents will be generated on the surrounding metal structures, and the secondary magnetic fields generated by the eddy currents in the imaging area will adversely affect the imaging quality. Therefore, an efficient shielding effect against the stray field of the gradient coil plays an important role in reducing eddy current interference.

In the planar permanent-magnet MRI system, the end face of the magnet near the imaging area is generally equipped with a polar plate for generating a uniform magnetic field. The polar plate is of a conductive structure, so eddy current shielding should be considered. Because the polar plate is generally planar, shielding against the stray field is merely needed on the surface of the polar plate when designing gradient shielding, so the shielding area is planar as well. However, the magnet structure of the planar superconducting MRI system is different from that of a permanent magnet. When designing planar superconducting MRI magnets, the distance between the outer magnet coils is generally set to be smaller than the distance between the inner magnet coils, which on the one hand increases the magnetic field efficiency of the outer coils, and on the other hand, the formed groove structure is just suitable for placing gradient coils. In this way, there are metal structures on the exterior and lateral sides of the gradient coil, and the traditional stray field shielding method only considering the planar area on the surface of the external magnet cannot effectively reduce the influence of the eddy current.

Chinese patent application CN101266289A puts forward a deformation space designing method of a transverse gradient coil in an open-bore MRI system, which only designs a main coil, without shielding against the stray field. Chinese patent application CN107064842A proposes a flat gradient coil and a manufacturing method thereof, and the gradient coils thereof includes non-shielding x gradient coils, non-shielding y gradient coils and ordinary shielding z gradient coils, wherein, in the shielding z gradient coils, the coil currents in the main coil layer run in the same direction and the coil currents in the shielding coil layer run in the same direction, in the absence of reverse coils. Chinese patent application CN108802645A proposes a designing method of a longitudinal gradient coil with an integer programming permanent magnet, in which the coil shielding area is a planar area located on the outer side of the shielding coil, and the stray field shielding problem on the lateral side of the gradient coil is not involved. Chinese patent application CN109696645A proposes an open-bore gradient coil with a curved structure, as compared with a common planar gradient coil, the main coil of the gradient coil is changed from a planar surface to a curved surface, so that the outer side of the coil is closer to the imaging area, while the shielding coil adopts a planar structure, wherein the designed gradient coil includes shielding x gradient coils, shielding y gradient coils and shielding z gradient coils, and the shielding area thereof is a surface of the polar plate of the magnet.

SUMMARY

The purpose of the present application is to overcome the shortcomings of the prior art, and to provide a method of designing a high shielding gradient coil and a gradient coil thereof according to the structural characteristics of a planar superconducting MRI system.

The method of designing a high shielding gradient coil for a planar superconducting MRI system according to the present application comprises the following steps:

Step 1, determining a shielding area to be the outer profile of the conductor structures on a magnet close to the gradient coil;

Step 2, calculating a stray field distribution of a non-shielding gradient coil in the shielding area;

Step 3, partitioning the shielding area according to the stray field distribution of the non-shielding gradient coil obtained in Step 2, and determining a stray field strength constraint at each partitioned zone, wherein, for a partitioned zone $S_i$ of the shielding area, the absolute value of the stray field strength does not exceed the determined stray field strength constraint value $B_{s_i}$, wherein i is a serial number of the partitioned zone of the shielding area;

Step 4, setting the stray field strength constraint determined according to each partitioned zone of the shielding area into a constraint condition of an optimization function, namely:

$$-B_{s_i} \leq s_{Bz_i} \leq B_{s_i} \tag{1}$$

wherein, $s_{Bz_i}$ is the stray field strength in the partitioned zone i of the shielding area;

Step 5, determining a target function for optimization design of the gradient coil, and setting a control deviation of the target magnetic field in the imaging area into the constraint condition of the optimization function.

Formula (2) is the target function for optimization design of the gradient coil of the present application, and formula (3) is a deviation constraint of the target magnetic field of the gradient coil in the imaging area of the present application. An optimization function is established according to the target function formula (2), the constraint condition formula (3) and the formula (1).

$$f = \sum_{i=1}^{M_1}\left(\sum_{j=1}^{N} a_{ij}x_j - t_i\right)^2 + \sum_{i=1}^{M_2}\left(\sum_{j=1}^{N} b_{ij}x_j\right)^2 + w_1 X^T L X + w_2 X^T R X \tag{2}$$

$$T_{Bz} - \varepsilon|T_{Bz}| \leq AX \leq T_{Bz} + \varepsilon|T_{Bz}| \tag{3}$$

In the formula (2), $a_{ij}$ is an element in a magnetic field calculation matrix from the imaging area to a coil plane, $b_{ij}$ is an element in a magnetic field calculation matrix from the shielding area to the coil plane; $x_j$ is an element in a stream function vector at the boundary element nodes when the gradient coil is designed using a boundary element method, $t_i$ is an element in a target magnetic field vector, X is the stream function vector at the boundary element nodes, and $X^T$ is a transposed vector of the stream function vector at the boundary element nodes, L is an inductance matrix, R is a resistance matrix, $M_1$ is the number of sampling points in the imaging area, $M_2$ is the number of sampling points in the shielding area, i and j are element position variables, $w_1$ and $w_2$ are weight factors, and $f$ is the target function.

In the formula (3), A is a magnetic field calculation matrix from the imaging area to the coil plane, $T_{Bz}$ is a target magnetic field vector, and ε is a maximum deviation of magnetic field gradient linearity.

Step 6, establishing an optimization function according to the above formulas, and executing an optimization design, so as to achieving a minimization solution of the target function shown in formula (2), where the magnetic field condition meets the requirements of the stray field strength constraint shown in formula (1) and the control deviation of the target magnetic field in the imaging area shown in formula (3). According to the calculation result of the stream function vector X, the structure and parameter information of the gradient coil is obtained by a method of stream function equipotential line. The an judgement will be executed to evaluate whether the structure and parameters of the gradient coil meet the design requirements. If the requirements are not met, for example, when the coils are too densely distributed, the stray field strength constraint can be selectively reduced and the design can be re-optimized, until the obtained structure and parameter information of the gradient coils meet the design requirements.

The gradient coil system of the present application comprises a transverse coil and a longitudinal coil, wherein the transverse coil includes an x gradient coil and a y gradient coil, and the longitudinal coil is a z gradient coil; a half of a single pole face of primary coils of the x gradient coil and the y gradient coil contain both a forward coil and a reverse coil, wherein the reverse coil has a current running direction opposite to that of the forward coil; a single pole face of a primary coil of the longitudinal coil, which is the z gradient coil, contains both a forward coil and a reverse coil, wherein the reverse coil has a current running direction opposite to that of the forward coil; and the shielding coils of the transverse gradient coil and the longitudinal gradient coil only contain coils in the same direction.

In the gradient coil system of the present application, at least the z gradient coil is a high shielding gradient coil, and both the x gradient coil and the y gradient coil are high shielding gradient coils, or ordinary shielding gradient coils or non-shielding gradient coils. The stray field shielding area of the high shielding gradient coil includes both a planar area in a magnet groove and a side area, so that the outer profile of the conductor structure on the magnet close to the gradient coil are fully shielded from the stray field; the ordinary shielding gradient coil refers to that the stray field shielding area of the gradient coil only comprises the planar area in the magnet groove; the non-shielding gradient coil refers to a gradient coil containing a primary coil and no shielding coil. The positional relationship of the coils are as follows: the primary coil is located in an inner layer and the shielding coil is located in an outer layer, wherein an x primary coil, a y primary coil and a z primary coil in the inner layer are not required to be arranged in a certain order, and an x shielding coil, a y shielding coil or a z shielding coil in the outer layer are also not required to be arranged in a certain order.

DETAILED DESCRIPTION

The present application will be further explained with reference to the accompanying drawings and specific embodiments.

Figure 1:
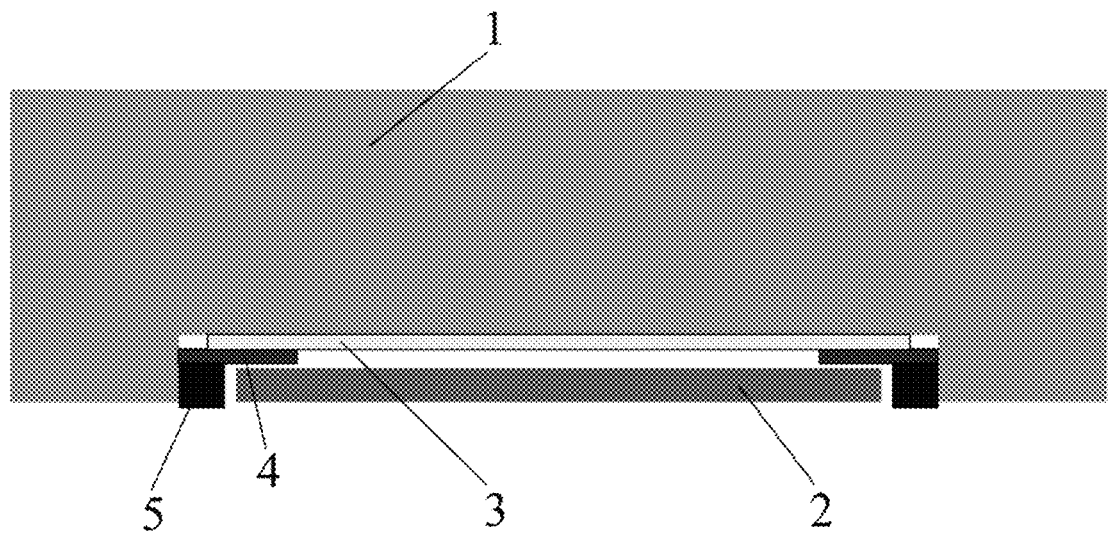
FIG. 1 is a schematic structural diagram of a planar superconducting magnet and gradient device according to the present application, in which 1 denotes a planar superconducting magnet, 2 denotes a planar gradient device with a gradient coil arranged therein, 3 denotes an anti-eddy current plate, 4 denotes a steel band ring, and 5 denotes a shimming ring.
Figure 4A:
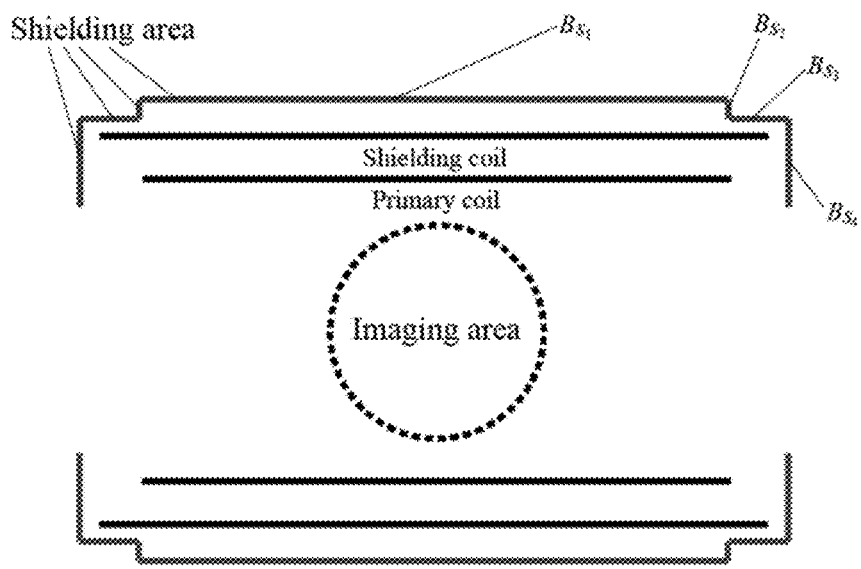
FIG. 4a is a schematic diagram of partitioning of the shielding area according to an outer profile of a conductor structure around the gradient coil and the corresponding stray field strength constraint when designing the high shielding gradient coil.
Figure 4B:
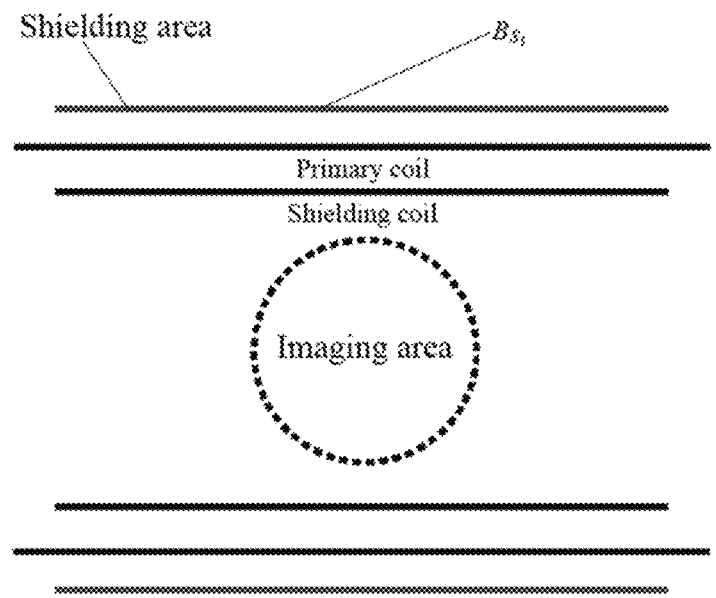
FIG. 4b is a schematic diagram of the stray field strength constraint only considering the planar area in a magnet groove when designing an ordinary shielding gradient coil.

As shown in FIG. 1, the high shielding gradient coil and its surrounding components for the planar superconducting MRI system of the present application include a planar superconducting magnet 1, a planar gradient assembly 2, an anti-eddy current plate 3, a steel band ring 4 and a shimming ring 5. The anti-eddy current plate 3 is laid to be closely fitted to the planar superconducting magnet 1, the steel band ring 4 is located between the anti-eddy current plate 3 and the shimming ring 5, the planar gradient assembly 2 is located in a groove surrounded by the anti-eddy current plate 3, the steel band ring 4 and the shimming ring 5, and the gradient coil is placed in the planar gradient assembly 2. In FIG. 4a and FIG. 4b, the area with a stray field constraint strength of $B_{s_1}$ corresponds to an outer profile of the anti-eddy current plate. In FIG. 4a, the areas with stray field constraint strengths of $B_{s_2}$ and $B_{s_3}$ correspond to an outer profile of the steel band ring 4, and the area with a stray field constraint strength of $B_{s_4}$ corresponds to an outer profile of the shimming ring 5.

According to actual demand, the gradient coil of the present application can include the following three modes of combination:

mode (1), including a high shielding x gradient coil, a high shielding y gradient coil and a high shielding z gradient coil;

mode (2), including an ordinary shielding x gradient coil, an ordinary shielding y gradient coil and a high shielding z gradient coil;

mode (3), including a non-shielding x gradient coil, a non-shielding y gradient coil and a high shielding z gradient coil.

Among them, the ordinary shielding gradient coils and non-shielding gradient coils can be designed according to existing methods. For example, in the structure of the planar superconducting MRI system of FIG. 1, if the anti-eddy current plate can effectively resist the eddy current generated by the transverse gradient coil, the combination mode (3) of the gradient coil can be adopted; if there is no space for installing the anti-eddy current plate in the planar superconducting MRI system, which is limited by practical engineering, the transverse ordinary shielding gradient coil with low complexity can be adopted, and the combination mode (2) of the gradient coil can be adopted; if there is no space for installing the anti-eddy current plate in the planar superconducting MRI system, and the transverse and longitudinal gradient coils both have very serious magnetic leakage on the lateral sides thereof, the combination mode (1) of the gradient coil can be adopted.

Figure 2:
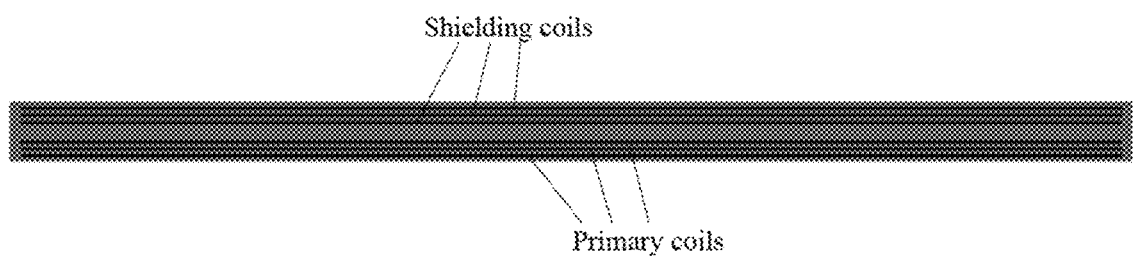
FIG. 2 shows the position arrangement of gradient coils in the planar gradient assembly.

The positional relationship of gradient coils in the present application is shown in FIG. 2: the primary coil is located in the inner layer and the shielding coil is located in the outer layer, wherein the x primary coil, the y primary coil and the z primary coil in the inner layer are not required to be arranged in a certain order, and the x shielding coil, the y shielding coil or the z shielding coil in the outer layer are also not required to be arranged in a certain order.

Figure 3:
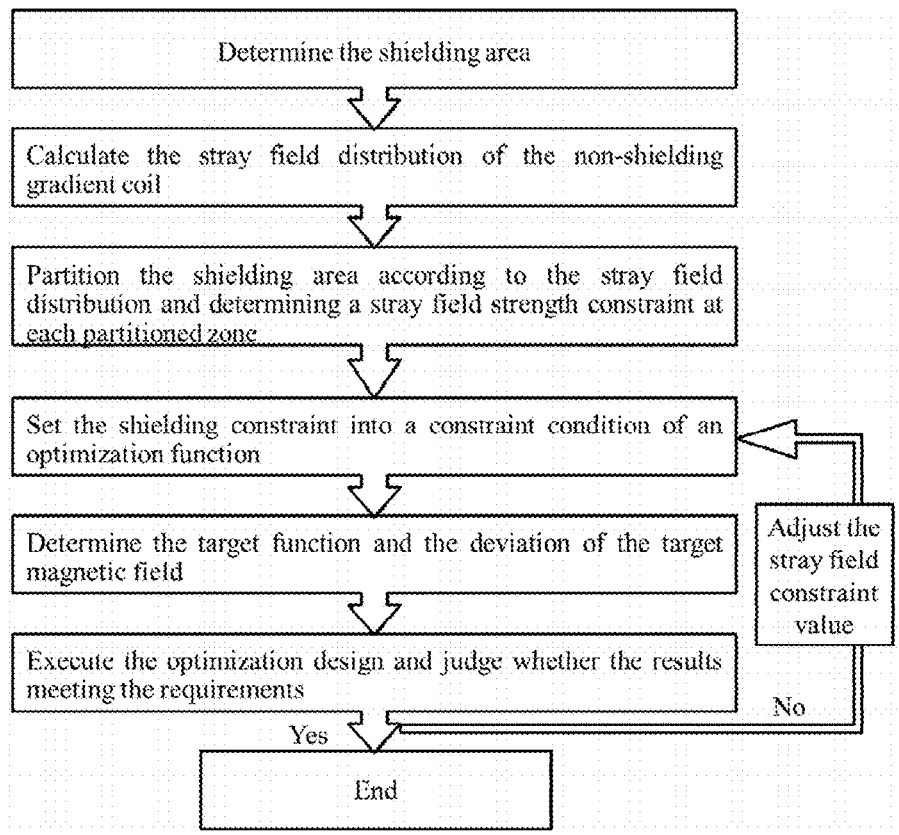
FIG. 3 shows the design steps of the high shielding gradient coil in the present application.

As shown in FIG. 3, according to an embodiment of the present application, the high shielding gradient coil is designed by the following steps:

Step 1, determining a shielding area to be an outer profile of a conductor structure around the gradient coil. As shown in FIG. 1, the anti-eddy current plate 3, the steel band ring 4 and the shimming ring 5 are conductor structures around the gradient coil, and the corresponding outer profile of the conductor structures is shown as the shielding area in FIG. 4a.

Figure 4C:
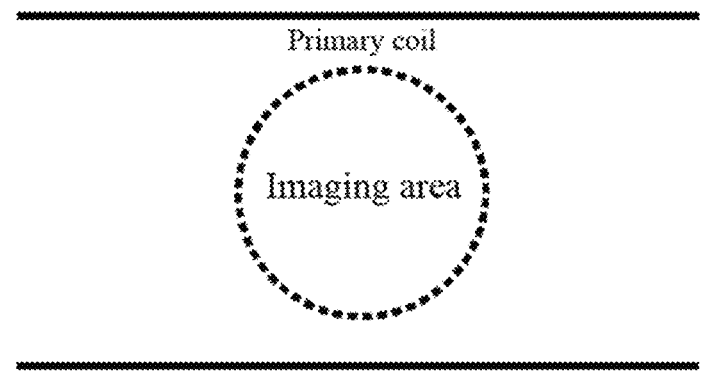
FIG. 4c is a schematic diagram showing the case comprising only a primary coil without any shielding coil when designing a non-shielding gradient coil.

Step 2, calculating a stray field distribution of a non-shielding gradient coil in the above shielding area, that is, designing a non-shielding gradient coil that meets the requirements for a magnetic field of the imaging area by adopting the design method shown in FIG. 4c which only comprises a primary coil and imposes no constraint on the shielding area, and calculating the stray field of the non-shielding gradient coil in the shielding area shown in FIG. 4a;

Step 3, partitioning the shielding area according to the stray field distribution of the non-shielding gradient coil, and determining a stray field strength constraint at each partitioned zone, wherein, for a partitioned zone $S_i$ of the shielding area, an absolute value of the corresponding stray field strength does not exceed $B_{si}$, wherein i is a serial number of the partitioned zone of the shielding area;

Step 4, setting the stray field strength constraint determined according to each partitioned zone of the shielding area into a constraint condition of an optimization function. In the numerical solution of the gradient coil, it is necessary to sample the shielding points in the shielding area. Taking FIG. 4a as an example, the magnetic field values of the shielding points need to meet the following requirements:

$$|s_{Bz_1}| \leq B_{s_1}$$

$$|s_{Bz_2}| \leq B_{s_2}$$

$$|s_{Bz_3}| \leq B_{s_3}$$

$$|s_{Bz_4}| \leq B_{s_4} \qquad (4)$$

wherein $s_{Bz_1}$, $s_{Bz_2}$, $s_{Bz_3}$ and $S_{Bz_4}$ are stray field values at corresponding sampling points of the zones of the shielding area partitioned according to the outer profile of the conductor structure around the gradient coil, where the stray field values are obtained according to current density of boundary elements, and $B_{s_1}$, $B_{s_2}$, $B_{s_3}$ and $B_{s_4}$ are stray field strength constraint values corresponding to the partitioned zones of the shielding area.

Figure 5:
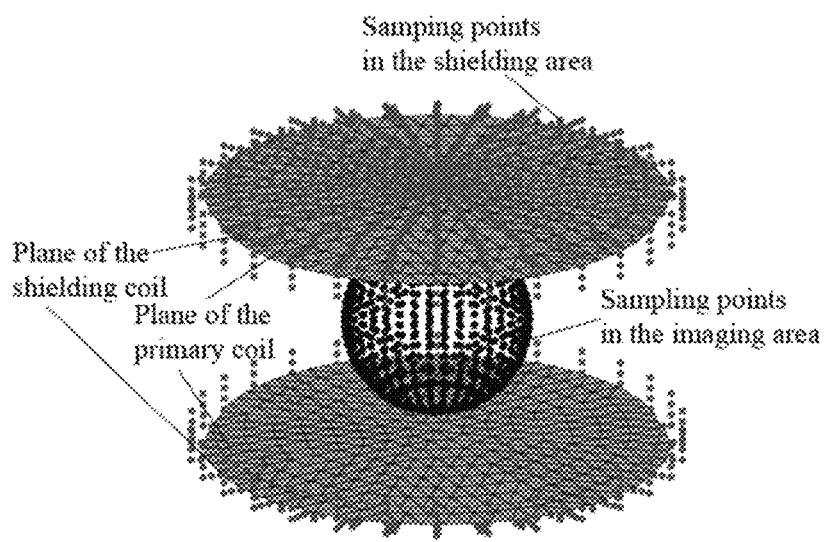
FIG. 5 is a schematic diagram of mesh generation, target point sampling and shielding area sampling when designing high shielding planar gradient coils by a boundary element method.

Step 5, determining a target function for optimization design of the gradient coil, and setting a control deviation of a target magnetic field of an imaging area into the constraint condition of the optimization function. FIG. 5 is a schematic diagram of a numerical calculation method for designing high shielding planar gradient coils by a boundary element method. When solving the gradient coil numerically, it is necessary to sample the target points in the imaging area, and the magnetic field values at the target points need to meet the following requirements:

$$|t_{Bz} - T_{Bz}| \leq \varepsilon |T_{Bz}| \qquad (5)$$

wherein $t_{Bz}$ is the magnetic field value of the target point obtained according to current density of boundary elements, $T_{Bz}$ is a pre-set target magnetic field, and $\varepsilon$ is the maximum deviation of the gradient linearity of the magnetic field.

Step 6, executing the optimization design to obtain the structure and parameter information of the gradient coil, and judging whether the information meets the requirements for configuration, if not, adjusting the stray field strength constraint, and performing optimization design until the obtained structure and parameter information of the gradient coil meets the design requirements.

A gradient coil system designed according to the design method of the present application comprises an x gradient coil, a y gradient coil and a z gradient coil, wherein at least the z gradient coil is a high shielding gradient coil, and both the x gradient coil and they gradient coil are high shielding gradient coils, or ordinary shielding gradient coils or non-shielding gradient coils.

According to Step 1 to Step 3 of the design method of the present application, a high shielding gradient coil that meets the requirements can be designed by adjusting the stray field strength constraint value. The stray field strength constraint value can be set in consideration of the stray field distribution of the non-shielding gradient coils, and the structures of high shielding gradient coils designed based on different stray field strength constraint values are varied.

The following Table 1 shows the dimensions of a gradient coil designed according to the design method of the present application, for a 0.7 T planar superconducting MRI system. The target gradient strength of the gradient coil is 15 mT/m, and the deviation of target magnetic field in the imaging area is less than 5%. The constraint values of stray field in shielding area are shown in Table 2, and the corresponding shielding area dimensions are shown in FIG. 4a, FIG. 4b and FIG. 4c. A high shielding x gradient coil and a high shielding z gradient coil are designed respectively according to the constraint parameters of the gradient coils. Since the coil structure of the high shielding y gradient coil is similar to that of the high shielding x gradient coil, except for a spatial phase difference of 90 degrees, the structure of the high shielding y gradient coil will not be described repeatedly herein.

TABLE 1

Design dimensions of a high shielding gradient coil

| Gradient coil | | Radius (r/m) | Height (z/m) |
|---|---|---|---|
| X gradient coil | main coil | 0.480 | ±0.238 |
| | shielding coil | 0.500 | ±0.283 |
| Y gradient coil | main coil | 0.480 | ±0.242 |
| | shielding coil | 0.500 | ±0.287 |
| Z gradient coil | main coil | 0.480 | ±0.246 |
| | shielding coil | 0.500 | ±0.291 |

TABLE 2

Constraint values of the stray field in the shielding area

| | x gradient coil | z gradient coil |
|---|---|---|
| $B_{s1}$ (Gauss) | 3.0 | 3.0 |
| $B_{s2}$ (Gauss) | 4.0 | 3.5 |
| $B_{s3}$ (Gauss) | 5.0 | 4.0 |
| $B_{s4}$ (Gauss) | 5.0 | 5.0 |

Figure 6A:
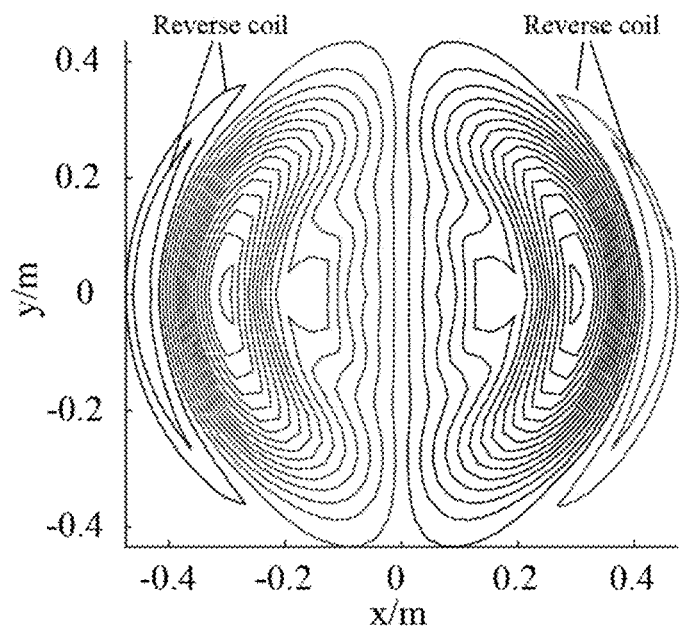
FIG. 6a is a two-dimensional structure diagram of an x primary coil of a gradient coil for a planar superconducting MRI system obtained according to the design method of the present application.
Figure 6B:
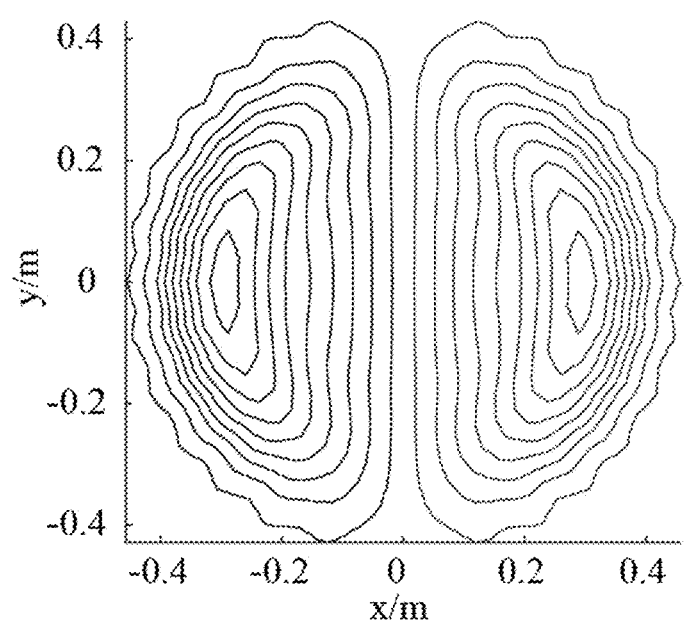
FIG. 6b is a two-dimensional structure diagram of an x shielding coil of a gradient coil for a planar superconducting MRI system obtained according to the design method of the present application.
Figure 6C:
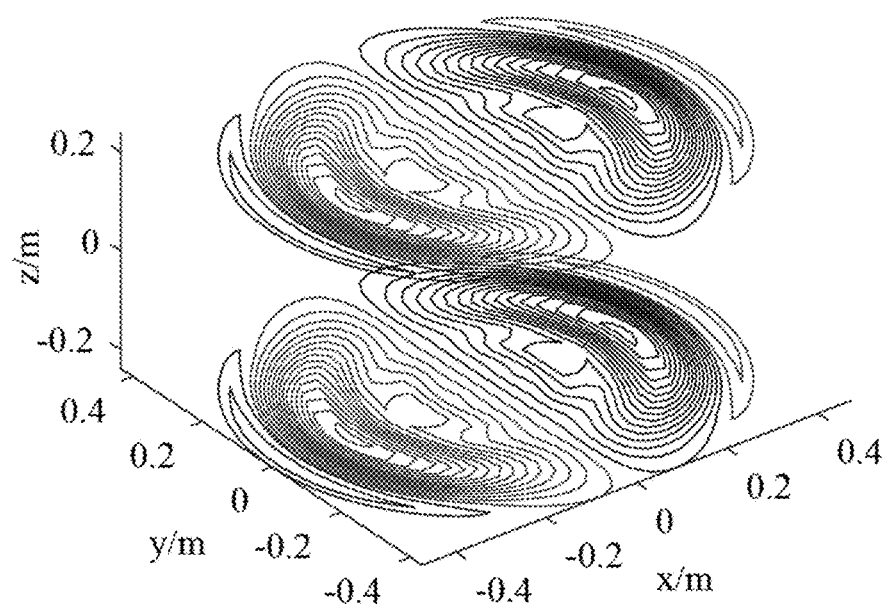
FIG. 6c is a three-dimensional structure diagram of an x primary coil of a gradient coil for a planar superconducting MRI system obtained according to the design method of the present application.
Figure 6D:
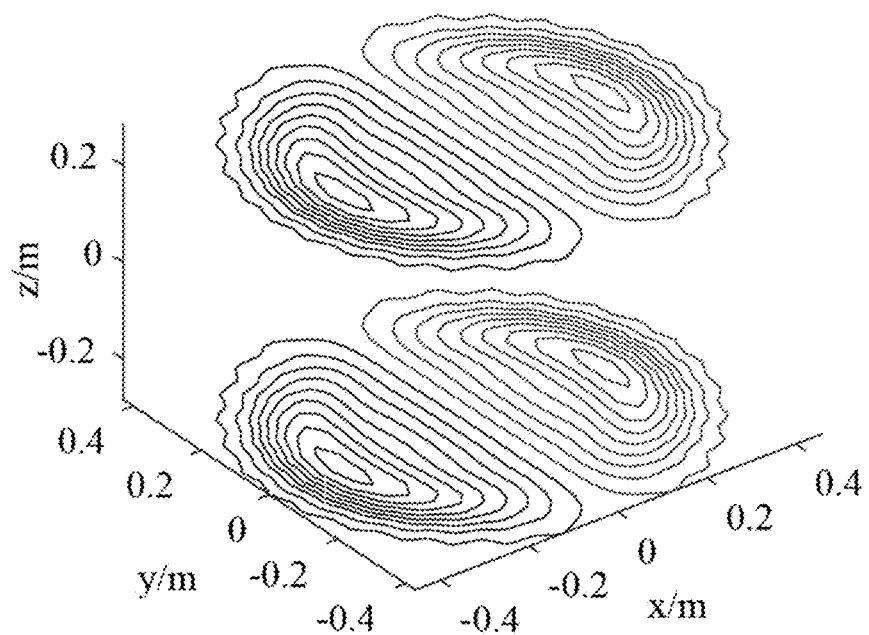
FIG. 6d is a three-dimensional structure diagram of an x shielding coil of a gradient coil for a planar superconducting MRI system obtained according to the design method of the present application.

FIGS. 6a, 6b, 6c and 6d show the structure of the high shielding x gradient coil, in which FIG. 6a shows a two-dimensional structure of the primary coil, FIG. 6b shows a two-dimensional structure of the shielding coil, FIG. 6c shows a three-dimensional structure of the primary coil and FIG. 6d shows a three-dimensional structure of the shielding coil. The structures of the primary coil in FIG. 6a and FIG. 6c comprise a reverse coil, which generates a magnetic field that offsets the leakage magnetic field of other coils, thereby eventually reducing the stray field of the high shielding x gradient coil.

Figure 7A:
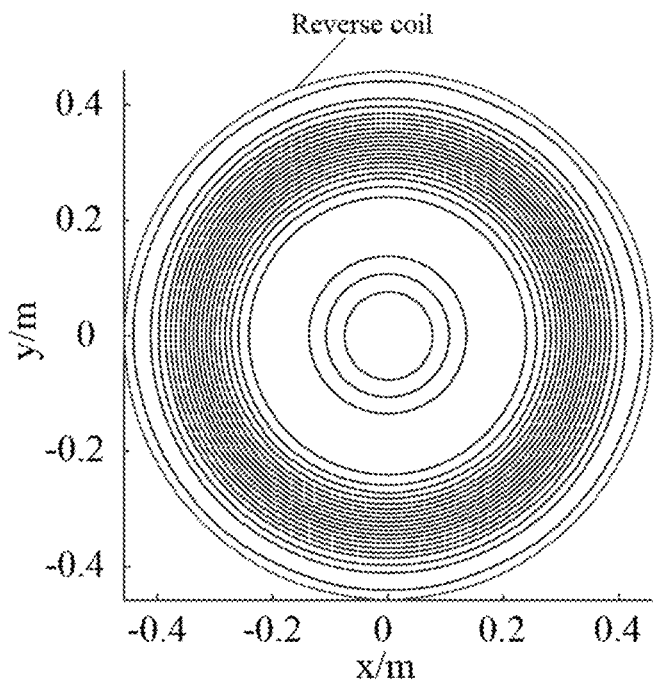
FIG. 7a is a two-dimensional structure diagram of a z primary coil of a gradient coil for a planar superconducting MRI system obtained according to the design method of the present application.
Figure 7B:
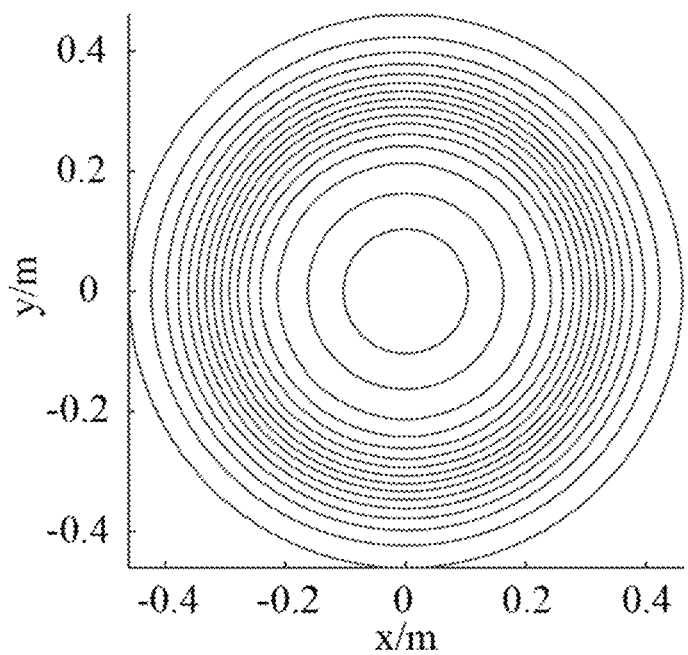
FIG. 7b is a two-dimensional structure diagram of a z shielding coil of a gradient coil for a planar superconducting MRI system obtained according to the design method of the present application.
Figure 7C:
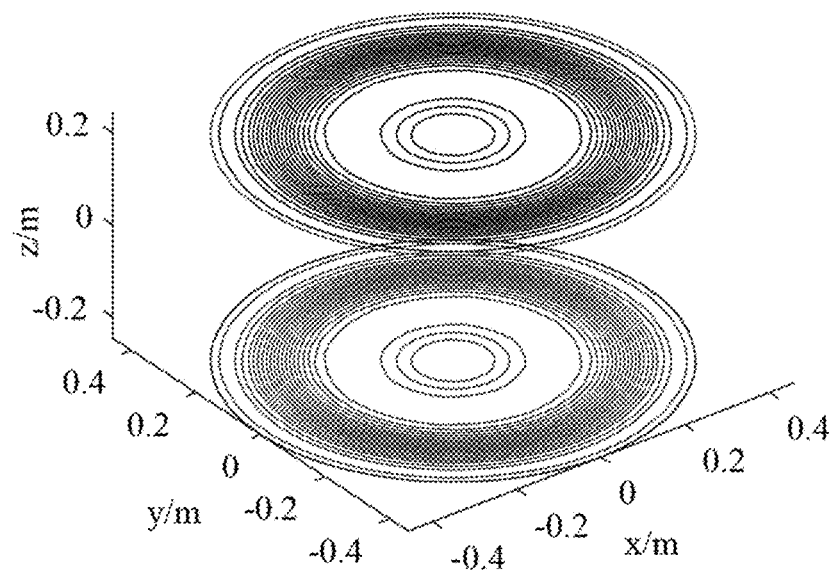
FIG. 7c is a three-dimensional structure diagram of a z primary coil of a gradient coil for a planar superconducting MRI system obtained according to the design method of the present application.
Figure 7D:
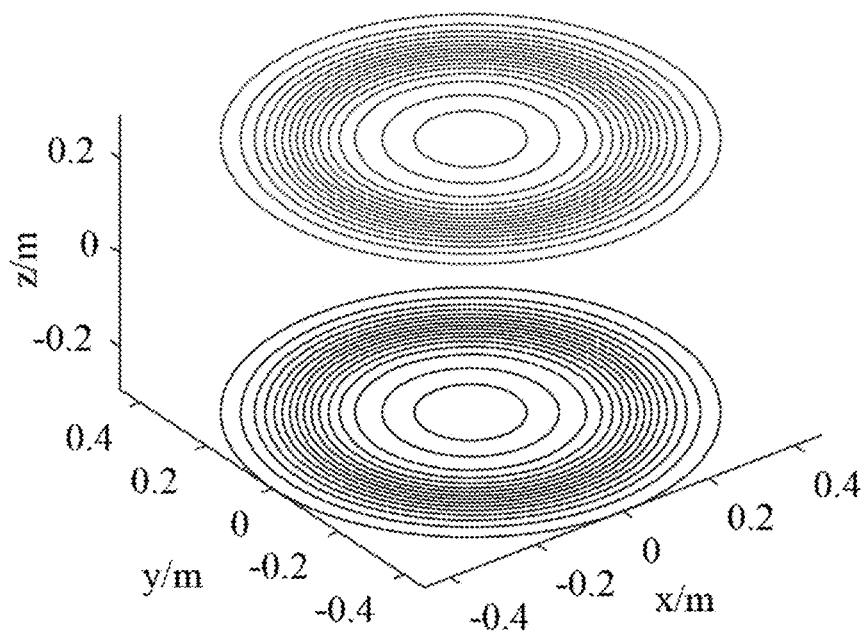
FIG. 7d is a three-dimensional structure diagram of a z shielding coil of a gradient coil for a planar superconducting MRI system obtained according to the design method of the present application.

FIGS. 7a, 7b, 7c and 7d show the structure of the high shielding z gradient coil, in which FIG. 7a shows a two-dimensional structure of the primary coil, FIG. 7b shows a two-dimensional structure of the shielding coil, FIG. 7c shows a three-dimensional structure of the primary coil and FIG. 7d shows a three-dimensional structure of the shielding coil. Similar to the high shielding x gradient coil, the structures of the primary coil of the high shielding z gradient coil in FIGS. 7a and 7c also comprise a reverse coil, which generates a magnetic field that offsets the leakage magnetic field of the other coils, thereby eventually reducing the stray field of the high shielding z gradient coil.

What is claimed is:

1. A method of designing a high shielding gradient coil for a planar superconducting magnetic resonance imaging (MRI) system, wherein, the method of designing the high shielding gradient coil comprises the following steps:

Step 1, determining a shielding area to be an outer profile of a conductor structure on a magnet close to a gradient coil;

Step 2, calculating a stray field distribution of a non-shielding gradient coil in the shielding area;

Step 3, partitioning the shielding area according to the stray field distribution of the non-shielding gradient coil obtained in Step 2, and determining a stray field strength constraint at each partitioned zone, wherein, for a partitioned zone $S_i$ of the shielding area, an absolute value of the stray field strength does not exceed the determined stray field strength constraint value $B_{si}$, wherein i is a serial number of the partitioned zone of the shielding area;

Step 4, setting the stray field strength constraint determined according to each partitioned zone of the shielding area into a constraint condition of an optimization function, namely:

$$-B_{s_i} \leq s_{B z_i} \leq B_{s_i} \quad (1)$$

wherein, $s_{B z_i}$ is the stray field strength in the partitioned zone i of the shielding area;

Step 5, determining a target function for optimization design of the gradient coil, and setting a control deviation of a target magnetic field of an imaging area into the constraint condition of the optimization function; and establishing the optimization function according to the target function, the control deviation constraint of the target magnetic field of the imaging area and the stray field strength constraint in Step 4;

Step 6, establishing the optimization function according to the target function determined in Step 5, and executing the optimization design to minimize the target function and simultaneously the magnetic field conditions meet the requirements for the stray field strength and the control deviation of the target magnetic field of the imaging area; obtaining a distribution of a stream function on the gradient coil according to a calculation result of a stream function X, and obtaining a structure and parameters of the gradient coil by a method of stream function equipotential line; and judging whether the structure and parameters of the gradient coil meet the design requirements, and if not, adjusting the stray field strength constraint and conducting re-optimization until the obtained structure and parameters of the gradient coil meet the design requirements.

2. The method of designing a high shielding gradient coil for a planar superconducting MRI system of claim 1, wherein, the target function for optimization design of the gradient coil in Step 5 is the following formula (2), and the deviation constraint of the target magnetic field of the gradient coil in the imaging area is the following formula (3), $$f = \sum_{i=1}^{M_1}\left(\sum_{j=1}^{N} a_{ij}x_j - t_i\right)^2 + \sum_{i=1}^{M_2}\left(\sum_{j=1}^{N} b_{ij}x_j\right)^2 + w_1 X^T L X + w_2 X^T R X \quad (2)$$

$$T_{Bz} - \varepsilon|T_{Bz}| \le AX \le T_{Bz} + \varepsilon|T_{Bz}| \quad (3)$$

in the formula (2), $a_{ij}$ is an element in a magnetic field calculation matrix from the imaging area to a coil plane, $b_{ij}$ is an element in a magnetic field calculation matrix from the shielding area to the coil plane; $x_j$ is an element in a stream function vector at boundary element nodes when the gradient coil is designed using a boundary element method, $t_i$ is an element in a target magnetic field vector, X is the stream function vector at the boundary element nodes, and $X^T$ is a transposed vector of the stream function vector at the boundary element nodes, L is an inductance matrix, R is a resistance matrix, $M_1$ is the number of sampling points in the imaging area, $M_2$ is the number of sampling points in the shielding area, i and j are element position variables, $w_1$ and $w_2$ are weight factors, and $f$ is the target function; and in the formula (3), A is a magnetic field calculation matrix from the imaging area to the coil plane, $T_{Bz}$ is a target magnetic field vector, and $\varepsilon$ is a maximum deviation of magnetic field gradient linearity.

3. A high shielding gradient coil system for a planar superconducting MRI system, wherein, the gradient coil system comprises a transverse coil and a longitudinal coil, wherein the transverse coil includes an x gradient coil and a y gradient coil, and the longitudinal coil is a z gradient coil; a half of a single pole face of primary coils of the x gradient coil and the y gradient coil contain both a forward coil and a reverse coil, wherein the reverse coil has a current running direction opposite to that of the forward coil; a single pole face of a primary coil of the longitudinal coil, which is the z gradient coil, contains both a forward coil and a reverse coil, wherein the reverse coil has a current running direction opposite to that of the forward coil; and shielding coils of the transverse gradient coil and the longitudinal gradient coil only contain coils in the same direction.

4. The gradient coil system of claim 3, wherein at least the z gradient coil is a high shielding gradient coil, and both the x gradient coil and the y gradient coil are high shielding gradient coils, or ordinary shielding gradient coils or non-shielding gradient coils; the stray field shielding area of the high shielding gradient coil includes both a planar area in a magnet groove and a side area, so that the outer profile of the conductor structure on the magnet close to the gradient coil are fully shielding from the stray field; the ordinary shielding gradient coil refers to that the stray field shielding area of the gradient coil only comprises the planar area in the magnet groove; the non-shielding gradient coil refers to a gradient coil containing a primary coil and no shielding coil; wherein the primary coil is located in an inner layer and the shielding coil is located in an outer layer, wherein x primary coil, y primary coil and z primary coil in the inner layer are not required to be arranged in a certain order, and x shielding coil, y shielding coil or z shielding coil in the outer layer are also not required to be arranged in a certain order.

\* \* \* \* \*